US 8,183,554 B2

(12) United States Patent
Mouttet

(10) Patent No.: US 8,183,554 B2
(45) Date of Patent: May 22, 2012

(54) SYMMETRICAL PROGRAMMABLE MEMRESISTOR CROSSBAR STRUCTURE

(76) Inventor: Blaise Laurent Mouttet, Arlington, VA (US)

( * ) Notice: Subject to any disclaimer, the term of this patent is extended or adjusted under 35 U.S.C. 154(b) by 1013 days.

(21) Appl. No.: 12/213,034

(22) Filed: Jun. 13, 2008

(65) Prior Publication Data

US 2008/0246116 A1    Oct. 9, 2008

Related U.S. Application Data

(63) Continuation-in-part of application No. 11/798,647, filed on May 16, 2007, now abandoned, which is a continuation-in-part of application No. 11/395,237, filed on Apr. 3, 2006, now Pat. No. 7,302,513.

(51) Int. Cl.
*H01L 29/06* (2006.01)
(52) U.S. Cl. ............ 257/9; 326/39; 326/41; 438/107; 438/129; 438/131; 438/455; 438/460
(58) Field of Classification Search .......... 438/107, 438/109, 113, 129, 131, 455, 458, 460, FOR. 386, 438/FOR. 395; 257/9; 326/39, 41
See application file for complete search history.

(56) References Cited

U.S. PATENT DOCUMENTS

| | | | |
|---|---|---|---|
| 4,597,162 A | 7/1986 | Johnson et al. | |
| 4,646,266 A | 2/1987 | Ovshinsky et al. | |
| 5,223,750 A | 6/1993 | Nichogi et al. | |
| 5,272,359 A | 12/1993 | Nagasubramanian et al. | |
| 5,912,839 A | 6/1999 | Ovshinsky et al. | |
| 6,128,214 A | 10/2000 | Kuekes et al. | |
| 6,198,655 B1 | 3/2001 | Heath et al. | |
| 6,248,674 B1 | 6/2001 | Kamins et al. | |
| 6,256,767 B1 | 7/2001 | Kuekes et al. | |
| 6,314,019 B1 | 11/2001 | Kuekes et al. | |
| 6,404,225 B1 * | 6/2002 | Rangasayee | 326/39 |
| 6,432,740 B1 | 8/2002 | Chen | |
| 6,459,095 B1 * | 10/2002 | Heath et al. | 257/14 |
| 6,518,156 B1 | 2/2003 | Chen et al. | |
| 6,531,371 B2 | 3/2003 | Hsu et al. | |
| 6,574,130 B2 | 6/2003 | Segal et al. | |
| 6,586,965 B2 | 7/2003 | Kuekes et al. | |
| 6,693,821 B2 | 2/2004 | Hsu et al. | |
| 6,746,971 B1 | 6/2004 | Ngo et al. | |
| 6,812,117 B1 | 11/2004 | Tringe | |
| 6,835,575 B2 | 12/2004 | Chen | |
| 6,846,682 B2 | 1/2005 | Heath et al. | |
| 6,854,092 B2 | 2/2005 | Hogg | |
| 6,867,996 B2 | 3/2005 | Campbell et al. | |
| 6,870,394 B2 | 3/2005 | Kuekes | |
| 6,880,146 B2 | 4/2005 | Snider | |
| 6,898,098 B2 | 5/2005 | Snider et al. | |

(Continued)

OTHER PUBLICATIONS

Ziegler et al., A Case for CMOS/Nano Co-design, ACM-SIGDA Emerging Technologies Seminar, Nov. 2002, 5 pgs.

(Continued)

*Primary Examiner* — N Drew Richards
*Assistant Examiner* — Joannie A Garcia

(57) ABSTRACT

A crossbar structure includes a first layer or layers including first p-type regions and first n-type regions, a second layer or layers including second p-type regions and second n-type regions, and a resistance programmable material formed between the first layer(s) and the second layer(s), wherein the first layer(s) and the second layer(s) include first and second intersecting wiring portions forming a crossbar array.

7 Claims, 3 Drawing Sheets

U.S. PATENT DOCUMENTS

| | | | |
|---|---|---|---|
| 6,900,479 B2 | 5/2005 | DeHon et al. | |
| 6,919,740 B2 | 7/2005 | Snider | |
| 6,940,744 B2 | 9/2005 | Rinerson et al. | |
| 6,960,783 B2 | 11/2005 | Lan et al. | |
| 6,963,077 B2 | 11/2005 | DeHon et al. | |
| 6,995,649 B2 | 2/2006 | Nugent | |
| 6,998,333 B2 | 2/2006 | Chen et al. | |
| 7,183,141 B1 | 2/2007 | Bulovic et al. | |
| 7,203,789 B2 | 4/2007 | Snider | |
| 7,358,524 B2 | 4/2008 | Lee et al. | |
| 7,359,888 B2 | 4/2008 | Snider | |
| 7,432,596 B1 * | 10/2008 | Bone | 257/747 |
| 2004/0041617 A1 * | 3/2004 | Snider et al. | 327/365 |
| 2006/0203541 A1 * | 9/2006 | Toda | 365/163 |
| 2007/0200158 A1 | 8/2007 | Genrikh et al. | |
| 2008/0090337 A1 | 4/2008 | Williams | |
| 2008/0138635 A1 * | 6/2008 | Chen et al. | 428/447 |

OTHER PUBLICATIONS

Lee et al., CMOL Crossnets as Pattern Classifiers, IWANN, 2005, pp. 446-454, Springer-Verlag Berlin Heidelberg.

Das et al., Architectures and Simulations for Nanoprocessor Systems Integrated on the Molecular Scale, Introducing Molecular Electronics, 2006, chap. 17, pp. 1-34.

Koch, Morphware, Scientific American, Aug. 2005, vol. 293, No. 2, pp. 56-63, Scientific American Inc.

* cited by examiner

SYMMETRICAL PROGRAMMABLE MEMRESISTOR CROSSBAR STRUCTURE

This application is a Continuation-in-Part of U.S. patent application Ser. No. 11/798,647, filed May 16, 2007 now abandoned, which is a Continuation-in-Part of U.S. patent application Ser. No. 11/395,237, now U.S. Pat. No. 7,302,513, filed Apr. 3, 2006.

CROSS-REFERENCE TO RELATED PATENTS AND PATENT APPLICATIONS

This patent application is related to the following patents and patent applications, which are each incorporated by reference in their entirety:
U.S. Pat. No. 7,302,513, entitled "Programmable Crossbar Signal Processor," filed Apr. 3, 2006.
U.S. Pat. No. 7,342,413, entitled "Programmable Crossbar Signal Processor with Input/Output Tip Interconnection," filed Apr. 26, 2007.
U.S. Pat. No. 7,378,870, entitled "Programmable Crossbar Signal Processor with Rectification Layer," filed Apr. 27, 2007.
U.S. patent application Ser. No. 11/395,232, entitled "Crossbar Arithmetic Processor," filed Apr. 3, 2006.
U.S. patent application Ser. No. 11/465,101, entitled "Interconnections for Crosswire Arrays," filed Aug. 16, 2006.
U.S. patent application Ser. No. 11/790,495, entitled "Programmable Crossbar Signal Processor as Morphware," filed Apr. 26, 2007.
U.S. patent application Ser. No. 11/790,496, entitled "Programmable Crossbar Signal Processor used in Image Processing," filed Apr. 26, 2007.
U.S. patent application Ser. No. 11/790,713, entitled "Programmable Crossbar Signal Processor with Op-Amp Outputs," filed Apr. 27, 2007.
U.S. patent application Ser. No. 11/798,647, entitled "Manufacture of Programmable Crossbar Signal Processor," filed May 16, 2007.
U.S. patent application Ser. No. 11/976,925, entitled "Crossbar Comparator," filed Oct. 30, 2007.
U.S. patent application Ser. No. 11/976,927, entitled "Crossbar Control Circuit," filed Oct. 30, 2007.
U.S. patent application Ser. No. 12/007,174, entitled "Crossbar Arithmetic and Summation Processor," filed Jan. 8, 2008.
U.S. patent application Ser. No. 12/081,793, entitled "Crossbar Waveform Driver Circuit," filed Apr. 22, 2008.

FIELD OF THE INVENTION

The present invention pertains to a crossbar structure used in a variety of applications including data storage systems, control systems, communication systems, and pattern recognition systems.

BACKGROUND OF THE INVENTION

Crossbar interconnect technology has been developed in recent years with a primary focus in applications in information storage and retrieval. A crossbar array basically comprises a first set of conductive or semiconductive parallel wires and a second set of conductive or semiconductive parallel wires formed so as to intersect the first set of wires. The intersections between the two sets of wires are separated by a thin film material or molecular component. A property of the material, such as the material resistance, may be altered by controlling the voltages applied between individual wires from the first and second set of wires. Alteration of the materials resistance at an intersection may be performed so as to achieve a high resistance or low resistance state and thus store digital data. It is noted that crossbar arrays are occasionally referred to as crosspoint or crosswire arrays.

Nagasubramanian et al. U.S. Pat. No. 5,272,359 discloses such a crossbar array employing a TCNQ doped organic conducting polymer as the material. Resistance variation from $10^{12}$ ohms to $10^7$ ohms is reported to be achieved by applying a 10V pulse with a 100 ms duration. Nagasubramanian et al. discusses the uses of the crossbar array as forming a memory matrix for an artificial neural net.

Other materials useful for electrically programmable resistance are those with a perovskite structure such as magnetoresistive materials (U.S. Pat. Nos. 6,531,371 and 6,693,821), a variety of organic semiconductors (U.S. Pat. Nos. 6,746,971 and 6,960,783), and silver-selenide/chalcogenide laminate films (U.S. Pat. No. 6,867,996).

Kuekes et al. U.S. Pat. No. 6,128,214 uses crossbars applicable at nanometer scales by employing molecular components as a bridging component between the wires. Such nanoscale crossbars have been disclosed as useful tools in molecular electronics capable of performing a variety of tasks including signal routing, multiplexing, and performing simple logic functions in U.S. Pat. Nos. 6,256,767, 6,314,019, 6,518,156, 6,586,965, 6,812,117, 6,854,092, 6,858,162, 6,870,394, 6,880,146, 6,898,098, 6,900,479, 6,919,740, 6,963,077, and 7,203,789. Molecular crossbar arrays used in neural networks is disclosed in U.S. Pat. No. 7,359,888. Manufacturing of molecular crossbar arrays is taught in U.S. Pat. Nos. 6,248,674, 6,432,740, 6,835,575, 6,846,682, and 6,998,333.

Examples of non-patent literature concerned with molecular crossbar arrays include Ziegler et al. "A Case for CMOS/nano Co-design," Lee et al. "CMOL Crossnets as Pattern Classifiers," and Das et al. "Architectures and Simulations for Nanoprocessor Systems Integrated On the Molecular Scale." Reinhold Koch provides a discussion of programmable crossbar arrays formed from ferroelectric material in Scientific American Vol. 293, No. 2 pgs. 56-63.

In the parent U.S. patent application Ser. No. 11/798,647 and U.S. Pat. No. 7,302,513, which are incorporated by reference in their entirety, a variety of different configurations of crossbar arrays are taught. In order to easily reprogram the states of the crossbar array symmetrical crossbar architectures are preferable so that reversal of a programmed impedance or resistance state is achievable without complex programming circuitry. Furthermore, the crossbar architectures should be designed to avoid or minimize feedback paths and electrical crosstalk within the crossbar array. The present patent application focuses on configurations to achieve these ends.

SUMMARY OF THE INVENTION

A crossbar structure includes a first layer or layers including first p-type regions and first n-type regions, a second layer or layers including second p-type regions and second n-type regions, and a resistance programmable material formed between the first layer(s) and the second layer(s), wherein the first layer(s) and the second layer(s) include first and second intersecting wiring portions forming a crossbar array.

In one embodiment, the first layer(s) comprise a first rectification layer having the first p-type region and first n-type region and having a first array of input wires on one side of the first rectification layer and a first array of output wires on an opposite side of the first rectification layer and the second layer(s) comprise a second rectification layer having the second p-type region and second n-type region and having a second array of input wires on one side of the second rectification layer and a second array of output wires on an opposite side of the second rectification layer.

In another embodiment the first p-type region is first p-type wiring, the first n-type region is first n-type wiring, the second p-type region is second p-type wiring, the second n-type region is second n-type wiring, the first p-type wiring is parallel to the first n-type wiring, and the second p-type wiring is parallel to the second n-type wiring.

The resistance programmable material may include a TCNQ-based material, a perovskite material, an oxide bi-layer material, a chalcogenide material, a rotaxane molecular material, a catenane molecular material or any other known material having a impedance or resistance which is programmable or switchable between different states. The crossbar may be a nanoscale crossbar array formed with crossed nanowires having widths or diameters less than 100 nm formed using self-assembly, nanoimprint lithography, e-beam lithography or other high resolution patterning methods. The crossbar may also be a microscale crossbar array formed with wires having widths or diameters greater than 100 nm patterned using optical lithography and semiconductor processing methods.

DETAILED DESCRIPTION

Figure 1:
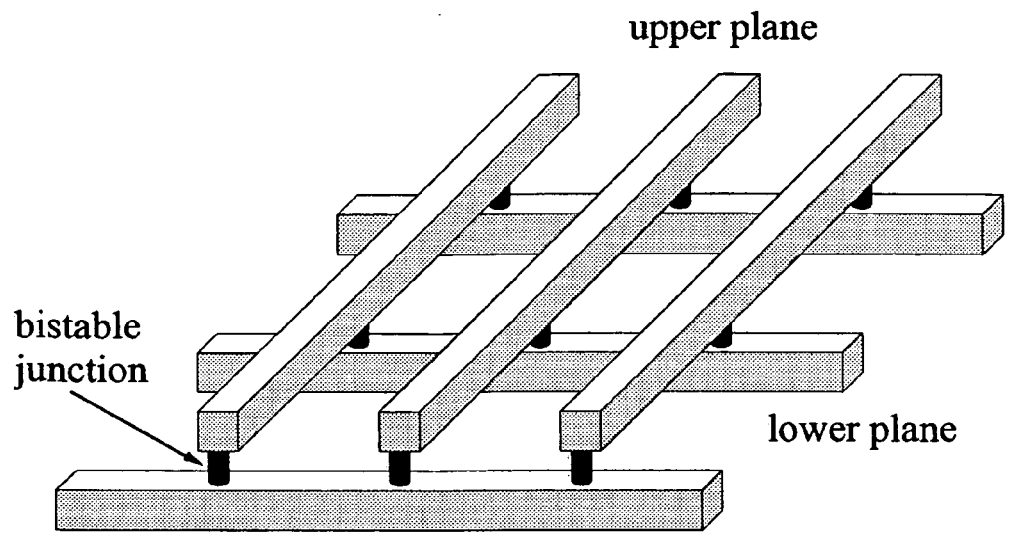
FIG. 1 illustrates a basic crossbar configuration as found in the prior art.

As disclosed by prior art such as Kuekes et al. U.S. Pat. No. 6,128,214, and as illustrated in FIG. 1, crossbar structures have been known to include an upper wiring plane and a lower wiring plane separated by bistable resistance junctions at the intersections of the two arrays of wires. In order to compensate for multiple unknown resistances Kuekes et al. teaches forming one of the wiring arrays of a p-type semiconductor material and the other of the wiring arrays of n-type semiconductor material (column 8, line 55-column 9, line 13 of Kuekes et al.). This helps avoid feedback paths within the crossbar array by building diode behavior into the junctions of the crossbar but also generates an asymmetry in the crossbar in which the reversal of a resistance state from a low resistance back to a high resistance requires the application of an additional voltage to overcome the reverse biased diode behavior. This additional voltage may potentially be damaging to the crossbar junctions and limit the life expectancy of the crossbar array. Thus better crossbar array designs are desirable to enable reconfigurable switching architectures having better life expectancy and to simplify the design of programming circuitry used to set and reset the resistance states of the crossbar array.

Figure 2:
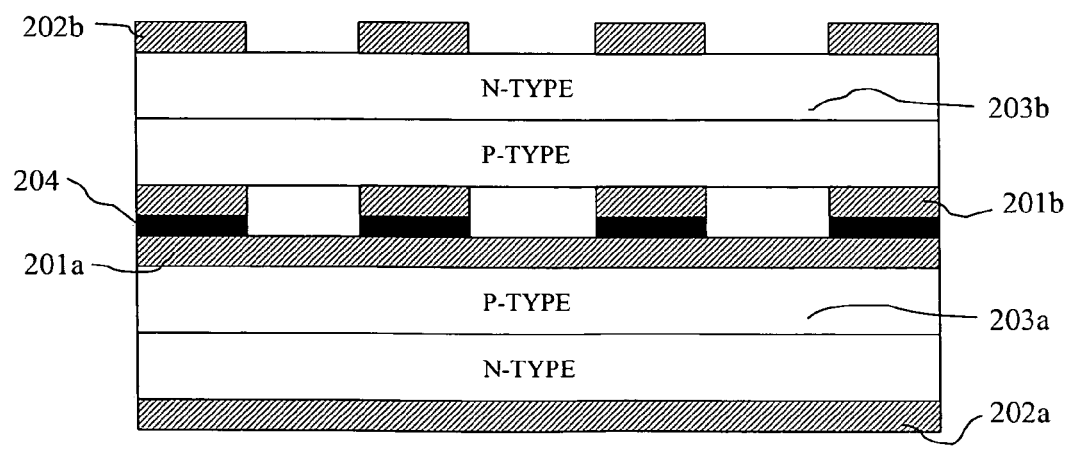
FIG. 2 illustrates a cross-section of a first embodiment of a crossbar array in accordance with the present invention.

FIG. 2 illustrates a cross-section of a first embodiment of a crossbar array in accordance with the present invention. This configuration is similar to that illustrated in FIG. 12b of U.S. Pat. No. 7,302,513 B2 and illustrates two semiconductor substrates 203a and 203b with metallic wiring arrays patterned on either side of the substrates. The first and second substrates 203a and 203b may be silicon substrates doped using ion implantation or diffusion to form rectification layers in which one side of the substrates are p-doped and the other side of the substrates are n-doped. Metallic wiring arrays 201a and 202a are patterned on either side of substrate 203a to form a series of parallel wires forming the lower plane of the crossbar array. Metallic wiring arrays 201b and 202b are patterned on either side of substrate 203b to form a series of parallel wires forming the upper plane of the crossbar array. In order to avoid crosstalk between the wiring arrays the substrates 203a, 203b may be selectively etched or doped in regions between the wires to limit lateral conductivity through the substrates. In this embodiment wiring array 202b is parallel to wiring array 201b and wiring array 202a is parallel to wiring array 201a. A resistance programmable material 204, which may include one or more material layers, is deposited or coated between the two substrates and the two substrates may be bonded using adhesive, a pressure spring, or other methods. In order to regulate the thickness of the resistance programmable material spacer material may optionally be provided between the two substrates. This particular configuration provides a first set of conduction paths from wiring arrays 201a to wiring arrays 202b which may be used to alter the resistance state of the material at selected crosspoints of the crossbar array by applying a first positive programming voltage above a threshold value specific to the particular material used for layer 204. The second set of conduction paths from wiring arrays 201b to wiring arrays to 202a may then be used to reverse the alteration of the selected resistance states when desired by applying a second positive programming voltage which, due to the geometry of the configuration, is opposite in polarity to the first positive programming voltage.

Figure 3:
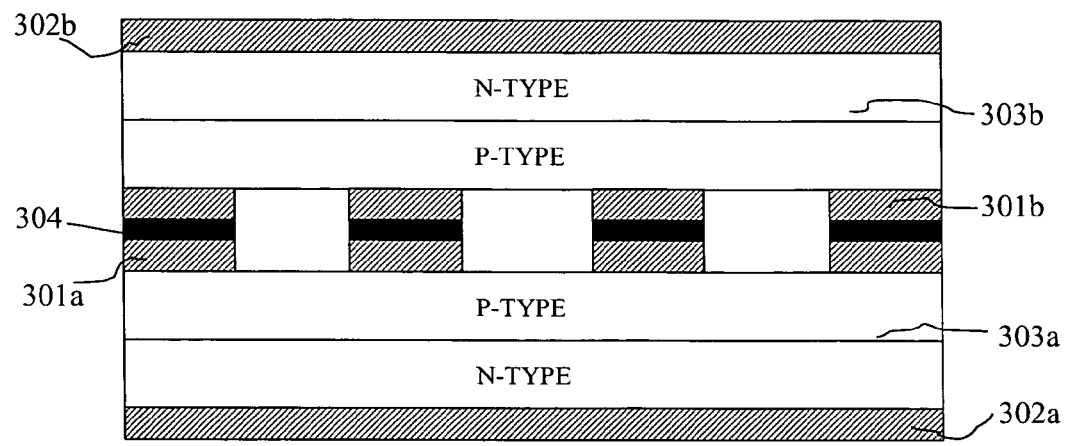
FIG. 3 illustrates a cross-section of a second embodiment of a crossbar array in accordance with the present invention.

FIG. 3 illustrates a cross-section of a second embodiment of a crossbar array in accordance with the present invention. This configuration is similar to that illustrated in FIG. 11b of U.S. Pat. No. 7,302,513 B2 and illustrates two semiconductor substrates 303a and 303b with metallic wiring arrays patterned on either side of the substrates. The first and second substrates 303a and 303b may be silicon substrates doped using ion implantation or diffusion to form rectification layers in which one side of the substrates are p-doped and the other side of the substrate is n-doped. Metallic wiring arrays 301a and 302a are patterned on either side of substrate 303a to form a series of parallel wires forming the lower plane of the crossbar array. Metallic wiring arrays 301b and 302b are patterned on either side of substrate 303b to form a series of parallel wires forming the upper plane of the crossbar array. In order to avoid crosstalk between the wiring arrays the substrates 303a, 303b may be selectively etched or doped in regions between the wires to limit lateral conductivity through the substrates. In this embodiment wiring array 302b is perpendicular to wiring array 301b and wiring array 302a is perpendicular to wiring array 301a. A resistance programmable material 304, which may include one or more material layers, is deposited or coated between the two substrates and the two substrates may be bonded using adhesive, a pressure spring, or other methods. In order to regulate the thickness of the resistance programmable material spacer material may optionally be provided between the two substrates. This particular configuration provides a first set of conduction paths from wiring arrays 301a to wiring arrays 302b which may be used to alter the resistance state of the material at selected crosspoints of the crossbar array by applying a first positive programming voltage above a threshold value specific to the particular material used for layer 304. The second set of conduction paths from wiring arrays 301b to wiring arrays to 302a may then be used to reverse the alteration of the selected resistance states when desired by applying a second positive programming voltage which, due to the geometry of the configuration, is opposite in polarity to the first positive programming voltage.

Figure 4:
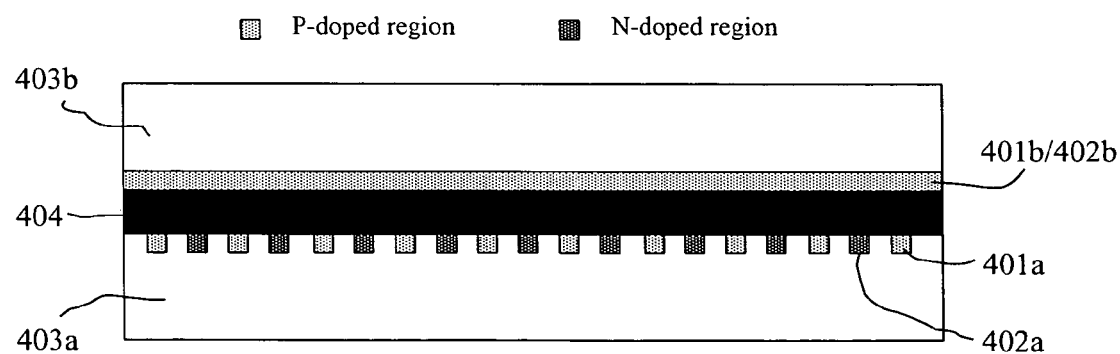
FIG. 4 illustrates a cross-section of a third embodiment of a crossbar array in accordance with the present invention.

FIG. 4 illustrates a cross-section of a third embodiment of a crossbar array in accordance with the present invention. A first silicon substrate 403a is doped to have an array of p-type wires 401a extending into the page and n-type wires 402a that are parallel to and interdigitated with wires 401a. A second silicon substrate 403b is similarly doped to have an array an array of p-type wires 401b extending perpendicularly to wires 401a and 402a and an array of n-type wires 402b that are parallel to and interdigitated with wires 401b. A resistance programmable material 404, which may include one or more material layers, is deposited or coated between the two substrates and the two substrates may be bonded using adhesive, a pressure spring, or other methods. In order to regulate the thickness of the resistance programmable material spacer material may optionally be provided between the two substrates. This particular configuration provides a first set of conduction paths from wiring arrays 401a to wiring arrays 402b which may be used to alter the resistance state of the material at selected crosspoints of the crossbar array by applying a first positive programming voltage above a threshold value specific to the particular material used for layer 404. The second set of conduction paths from wiring arrays 401b to wiring arrays to 402a may then be used to reverse the alteration of the selected resistance states when desired by applying a second positive programming voltage which, due to the geometry of the configuration, is opposite in polarity to the first positive programming voltage.

Figure 5:
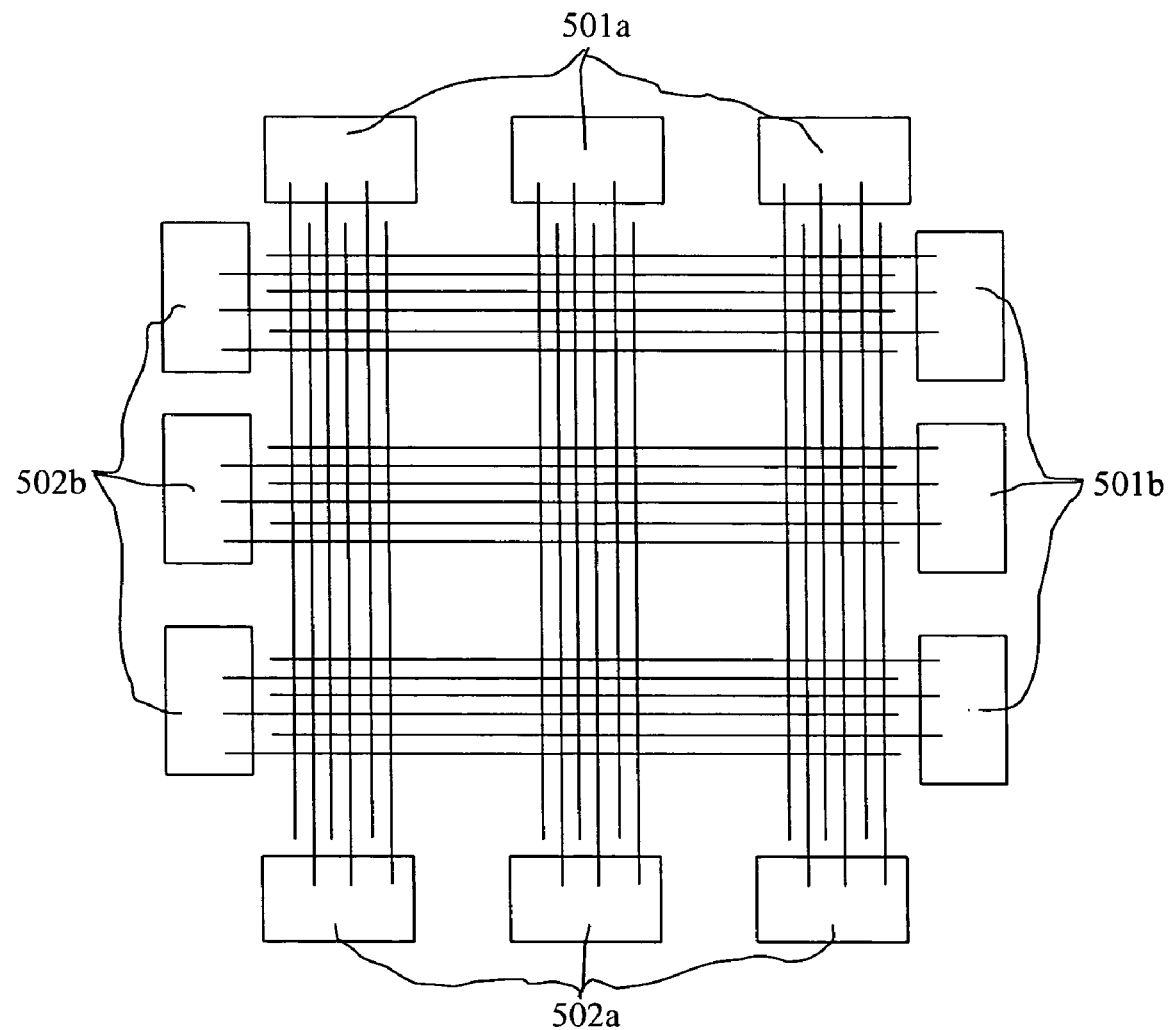
FIG. 5 illustrates a top view of the wiring architecture for the third embodiment of the crossbar array.

FIG. 5 illustrates a top view of the wiring architecture for the third embodiment of the crossbar array. Peripheral electrode contacts 501a, 501b, 502a, and 502b are patterned on substrates 403a and 403b so as to electrically contact respective wiring arrays 401a, 401b, 402a, and 402b. Each of the electrodes 501a and 501b may be selected to simultaneously provide a program voltage to multiple wires in the crossbar array and each of the electrodes 502a and 502b may be selected to simultaneously ground multiple wires in the crossbar array to either program (i.e. write) or de-program (i.e. erase) the alteration in one or more intersecting regions of the crossbar array. The purpose of this configuration is so that the first set of conduction paths (from one of the electrodes 501a to one of the electrodes 502b) used in altering a particular resistance state of a crosspoint overlap with the second set of conduction paths (from one of the electrodes 501b to one of the electrodes 502a) used in reversing the altered resistance. In this embodiment the thickness of the resistance programmable material layer 404 should be sufficiently greater than the pitch between the wiring arrays 401a/402a or 401b/402b in order for the electric fields from individual wires to properly extend to regions adjacent neighboring wires. While the configuration of FIG. 5 is effectively equivalent to a 3×3 crossbar it is noted that other crossbar sizes are within the scope of the invention (e.g. 2×2, 2×3, 3×4, 4×4, ..., 100×100, etc.). The number of wires electrically connected to each electrode may also be larger than three which may provide additional reliability in the case that nanowires are used for the wiring.

As understood by one of ordinary skill in the art a variety of alternatives may be used in the fabrication and material structures used for the present invention. For example, in the fabrication described in relation to FIGS. 2-4 dual semiconductor substrates form the first and second layers between which a layer of the resistance programmable material is laminated or coated. As an alternative, thin film deposition using techniques such as physical vapor deposition, chemical vapor deposition, or atomic layer deposition may be used to sequentially deposit the various layers on a single substrate with appropriate patterning steps such as optical lithography, e-beam lithography, self-assembly, or nanoimprint lithography used to form the wiring arrays. Another alternative may employ non-silicon semiconductor materials in which case the first and second layers are organic or polymeric materials so that the n-type material is an electron donor material and the p-type material is an electron acceptor material (see Aviram et al. U.S. Pat. No. 3,953,874 for one example of such organic electronics). It is noted that in all of the embodiments the resistance programmable material formed between the first and second layer is materially distinct form the material used to form the p-type and n-type regions so that the layers which include the p-type and n-type regions have fixed electrical properties in contrast to the resistance programmable material layers which have variable electrical properties that depend on the voltages pulses used in programming the material.

There are a large variety of resistance switching materials applicable to the present invention including phase change materials such as chalcogenides, bi-stable molecular switches such as catenanes or rotaxanes, perovskites, TCNQ-doped films, and bi-layer oxides referred to as "memristors" by some sources. Table 1 below is an abbreviated listing of these materials and examples of related patent references.

TABLE 1

| Resistance switching material | Examples of related patent references |
| --- | --- |
| Bi-layer oxides | U.S. patent application 2007/0200158, U.S. patent application 2008/0090337 |
| Catenanes | U.S. Pat. No. 6,198,655 |
| Chalcogenides | U.S. Pat. No. 4,597,162 |
| Ionic Complexes | U.S. Pat. No. 7,183,141 |
| Perovskites | U.S. Pat. No. 6,531,371 |
| Rotaxanes | U.S. Pat. No. 6,128,214 |
| TCNQ-doped organic polymer | U.S. Pat. No. 5,272,359 |

The crossbar array of the present patent application is applicable to a wide variety of device applications such as non-volatile memory in which changing resistance states of the crossbar array between high and low levels is equivalent to writing or erasing bit data. Other applications include reconfigurable logic, neural networks, arithmetic processing, communications systems, control systems, pattern or image processing, and waveform generation circuitry. Table 2 below provides examples of related patent references discussing these applications.

TABLE 2

| Application of Crossbar Resistance Switch Array | Examples of related patent references |
| --- | --- |
| Non-volatile memory | U.S. Pat. No. 6,128,214, U.S. Pat. No. 6,531,371, U.S. Pat. No. 6,574,130 |
| Reconfigurable logic | U.S. Pat. No. 4,646,266, U.S. Pat. No. 7,203,789 |
| Neural networks | U.S. Pat. No. 5,272,359, U.S. Pat. No. 7,359,888 |
| Arithmetic processing | U.S. patent application Ser. No. 11/395,232 and U.S. patent application Ser. No. 12/007,174 |

TABLE 2-continued

| Application of Crossbar Resistance Switch Array | Examples of related patent references |
|---|---|
| Communication systems | U.S. Pat. No. 7,302,513 |
| Control systems | U.S. Pat. No. 7,302,513, U.S. patent application Ser. No. 11/976,927 |
| Pattern comparison/image processing | U.S. Pat. No. 7,302,513, U.S. patent application Ser. No. 11/976,925 |
| Programmable waveform circuitry | U.S. Pat. No. 7,302,513, U.S. patent application Ser. No. 12/081,793 |

As described above many modifications and applications of the present invention are possible. However, the present invention is only limited by the following claims.

I claim:

1. A crossbar structure comprising:
a first layer or layers including at least one first p-type region and at least one first n-type region;
a second layer or layers including at least one second p-type region and at least one second n-type region; and
a resistance programmable material formed between the first layer(s) and the second layer(s),
wherein the first layer(s) and the second layer(s) include first and second intersecting wiring portions forming a crossbar array,
wherein the first layer(s) comprise a first rectification layer having the first p-type region and first n-type region and having a first array of input wires on one side of the first rectification layer and a first array of output wires on an opposite side of the first rectification layer and the second layer(s) comprise a second rectification layer having the second p-type region and second n-type region and having a second array of input wires on one side of the second rectification layer and a second array of output wires on an opposite side of the second rectification layer,
wherein the first array of input wires is not parallel to the first array of output wires and the second array of input wires is not parallel to the second array of output wires.

2. The crossbar structure of claim 1 wherein the first array of input wires is perpendicular to the first array of output wires and the second array of input wires is perpendicular to the second array of output wires.

3. A crossbar structure comprising:
a first layer or layers including at least one first p-type region and at least one first n-type region and including a first array of input wires formed on one side of the first layer(s) and a first array of output wires formed on an opposite side of the first layer(s);
a second layer or layers including at least one second p-type region and at least one second n-type region and including a second array of input wires formed on one side of the second layer(s) and a second array of output wires formed on an opposite side of the second layer(s); and
a resistance programmable material formed between the first layer(s) and the second layer(s),
wherein the first array of input wires is not parallel to the first array of output wires and the second array of input wires is not parallel to the second array of output wires.

4. The crossbar structure of claim 3 wherein the first array of input wires is perpendicular to the first array of output wires and the second array of input wires is perpendicular to the second array of output wires.

5. A crossbar structure comprising:
a first layer or layers including a first array of p-type input wires and a first array of n-type output wires;
a second layer or layers including a second array of p-type input wires and a second array of n-type output wires; and
a resistance programmable material formed between the first layer(s) and the second layer(s),
wherein the first array of p-type input wires are not parallel with the second array of n-type output wires and the second array of p-type input wires are not parallel with the first array of n-type output wires.

6. The crossbar structure of claim 5 wherein the first array of p-type input wires are perpendicular to the second array of n-type output wires and the second array of p-type input wires are perpendicular to the first array of n-type output wires.

7. The crossbar structure of claim 5 wherein the first array of p-type input wires and the first array of n-type output wires are formed on the same side of a first substrate and are interdigitated with one another and wherein the second array of p-type input wires and the second array of n-type output wires are formed on the same side of a second substrate and are interdigitated with one another.

* * * * *